(12) United States Patent
Pesavento et al.

(10) Patent No.: US 7,796,450 B1
(45) Date of Patent: *Sep. 14, 2010

(54) RADIO FREQUENCY (RFID) TAG INCLUDING CONFIGURABLE SINGLE BIT/DUAL BITS MEMORY

(75) Inventors: Alberto Pesavento, Seattle, WA (US); Jamie L. Langlinais, Seattle, WA (US)

(73) Assignee: Virage Logic Corporation, Fremont, CA (US)

( * ) Notice: Subject to any disclaimer, the term of this patent is extended or adjusted under 35 U.S.C. 154(b) by 108 days.

This patent is subject to a terminal disclaimer.

(21) Appl. No.: 12/012,910

(22) Filed: Feb. 5, 2008

Related U.S. Application Data

(62) Division of application No. 11/981,056, filed on Oct. 30, 2007, now Pat. No. 7,719,896.

(60) Provisional application No. 60/925,939, filed on Apr. 24, 2007.

(51) Int. Cl.
*G11C 7/00* (2006.01)

(52) U.S. Cl. .................. 365/192; 365/185.21; 365/207; 365/230.03

(58) Field of Classification Search ............ 365/185.21, 365/207, 230.03, 192
See application file for complete search history.

(56) References Cited

U.S. PATENT DOCUMENTS

| 4,037,242 A | 7/1977 | Gosney |
| 4,158,239 A | 6/1979 | Bertin |
| 4,541,073 A | 9/1985 | Brice et al. |
| 4,571,704 A | 2/1986 | Bohac, Jr. |
| 4,758,869 A | 7/1988 | Eitan et al. |
| 4,899,070 A | 2/1990 | Ou et al. |
| 4,935,702 A | 6/1990 | Mead et al. |
| 5,016,217 A | 5/1991 | Brahmbhatt |
| 5,018,102 A | 5/1991 | Houston |
| 5,068,622 A | 11/1991 | Mead et al. |
| 5,086,331 A | 2/1992 | Hartgring et al. |

(Continued)

FOREIGN PATENT DOCUMENTS

EP 0 298 618 1/1989

(Continued)

OTHER PUBLICATIONS

Chang, L. et al., "Non-Volatile Memory Device With True CMOS Compatibility", Electronics Letters, vol. 35, No. 17, Aug. 19, 1999, pp. 1443-1445.

(Continued)

*Primary Examiner*—Huan Hoang
(74) *Attorney, Agent, or Firm*—Nixon Peabody LLP; David B. Ritchie

(57) ABSTRACT

A configurable memory device includes an array of configurable memory units arranged into rows and columns. The configurable memory unit includes a memory cell comprising a first storage element configured to store a first value and a second storage element configured to store a second value. The memory unit can be either a single-ended or a differential configuration. In the single-ended configuration, the stored value of each storage element is interpreted as one bit. In the differential configuration, the stored first and second values of the storage elements are interpreted as a differential single bit. An external control signal determines in which configuration the unit is in.

23 Claims, 13 Drawing Sheets

U.S. PATENT DOCUMENTS

| | | |
|---|---|---|
| 5,101,378 A | 3/1992 | Radjy et al. |
| 5,124,568 A | 6/1992 | Chen et al. |
| 5,197,028 A | 3/1993 | Nakai |
| 5,272,368 A | 12/1993 | Turner et al. |
| 5,323,066 A | 6/1994 | Feddeler et al. |
| 5,430,670 A | 7/1995 | Rosenthal |
| 5,438,542 A | 8/1995 | Atsumi et al. |
| 5,450,363 A | 9/1995 | Christopherson et al. |
| 5,463,348 A | 10/1995 | Sarpeshkar et al. |
| 5,515,317 A | 5/1996 | Wells et al. |
| 5,517,044 A | 5/1996 | Koyama |
| 5,541,878 A | 7/1996 | LeMoncheck et al. |
| 5,574,879 A | 11/1996 | Wells et al. |
| 5,596,524 A | 1/1997 | Lin et al. |
| 5,617,358 A | 4/1997 | Kodama |
| 5,627,392 A | 5/1997 | Diorio et al. |
| 5,633,518 A | 5/1997 | Broze |
| 5,659,498 A | 8/1997 | Pascucci et al. |
| 5,666,307 A | 9/1997 | Chang |
| 5,677,917 A | 10/1997 | Wheelus et al. |
| 5,687,118 A | 11/1997 | Chang |
| 5,691,939 A | 11/1997 | Chang et al. |
| 5,706,227 A | 1/1998 | Chang et al. |
| 5,717,636 A | 2/1998 | Dallabora et al. |
| 5,729,155 A | 3/1998 | Kobatake |
| 5,731,716 A | 3/1998 | Pascucci |
| 5,736,764 A | 4/1998 | Chang |
| 5,761,121 A | 6/1998 | Chang |
| 5,777,361 A | 7/1998 | Parris et al. |
| 5,777,926 A | 7/1998 | Trinh et al. |
| 5,787,038 A | 7/1998 | Park |
| 5,790,060 A | 8/1998 | Tesch |
| 5,796,656 A | 8/1998 | Kowshik et al. |
| 5,798,967 A | 8/1998 | Sarin et al. |
| 5,801,994 A | 9/1998 | Chang et al. |
| 5,825,063 A | 10/1998 | Diorio et al. |
| 5,835,402 A | 11/1998 | Rao et al. |
| 5,841,165 A | 11/1998 | Chang et al. |
| 5,844,300 A | 12/1998 | Alavi et al. |
| 5,854,762 A | 12/1998 | Pascucci |
| 5,864,569 A | 1/1999 | Roohparvar |
| 5,875,126 A | 2/1999 | Minch et al. |
| 5,886,566 A | 3/1999 | Park et al. |
| 5,892,712 A | 4/1999 | Hirose et al. |
| 5,898,613 A | 4/1999 | Diorio et al. |
| 5,901,084 A | 5/1999 | Ohnakado |
| 5,912,841 A | 6/1999 | Kim |
| 5,912,842 A | 6/1999 | Chang et al. |
| 5,912,937 A | 6/1999 | Goetting et al. |
| 5,914,894 A | 6/1999 | Diorio et al. |
| 5,939,945 A | 8/1999 | Thewes et al. |
| 5,966,329 A | 10/1999 | Hsu et al. |
| 5,969,987 A | 10/1999 | Blyth et al. |
| 5,972,804 A | 10/1999 | Tobin et al. |
| 5,982,669 A | 11/1999 | Kalnitsky et al. |
| 5,986,927 A | 11/1999 | Minch et al. |
| 5,990,512 A | 11/1999 | Diorio et al. |
| 6,002,623 A | 12/1999 | Stave et al. |
| 6,028,789 A | 2/2000 | Mehta et al. |
| 6,055,185 A | 4/2000 | Kalnitsky et al. |
| 6,060,919 A | 5/2000 | Wilson et al. |
| 6,081,451 A | 6/2000 | Kalnitsky et al. |
| 6,097,637 A | 8/2000 | Bauer et al. |
| 6,111,785 A | 8/2000 | Hirano |
| 6,125,053 A | 9/2000 | Diorio et al. |
| 6,130,612 A | 10/2000 | Castellano et al. |
| 6,137,153 A | 10/2000 | Le et al. |
| 6,137,722 A | 10/2000 | Kalnitsky et al. |
| 6,137,723 A | 10/2000 | Bergemont et al. |
| 6,137,724 A | 10/2000 | Kalnitsky et al. |
| 6,141,247 A | 10/2000 | Roohparvar et al. |
| 6,144,581 A | 11/2000 | Diorio et al. |
| 6,166,954 A | 12/2000 | Chern |
| 6,166,978 A | 12/2000 | Goto |
| 6,190,968 B1 | 2/2001 | Kalnitsky et al. |
| 6,208,557 B1 | 3/2001 | Bergemont et al. |
| 6,214,666 B1 | 4/2001 | Mehta |
| 6,222,765 B1 | 4/2001 | Nojima |
| 6,233,717 B1 | 5/2001 | Choi |
| 6,294,427 B1 | 9/2001 | Furuhata et al. |
| 6,320,788 B1 | 11/2001 | Sansbury et al. |
| 6,331,949 B1 | 12/2001 | Hirano |
| 6,353,568 B1 | 3/2002 | Sung |
| 6,359,810 B1 | 3/2002 | Gupta et al. |
| 6,363,006 B2 | 3/2002 | Naffziger et al. |
| 6,363,008 B1 | 3/2002 | Wong |
| 6,363,011 B1 | 3/2002 | Hirose et al. |
| 6,384,451 B1 | 5/2002 | Caywood |
| 6,452,835 B1 | 9/2002 | Diorio et al. |
| 6,456,992 B1 | 9/2002 | Shibata et al. |
| 6,469,930 B1 | 10/2002 | Murray |
| 6,469,937 B2 | 10/2002 | Fuchigami et al. |
| 6,477,103 B1 | 11/2002 | Nguyen et al. |
| 6,479,863 B2 | 11/2002 | Caywood |
| 6,522,584 B1 | 2/2003 | Chen et al. |
| 6,529,407 B2 | 3/2003 | Shukuri |
| 6,534,816 B1 | 3/2003 | Caywood |
| 6,549,457 B1 | 4/2003 | Srinivasan et al. |
| 6,558,967 B1 | 5/2003 | Wong |
| 6,563,731 B1 | 5/2003 | Bergemont |
| 6,573,765 B2 | 6/2003 | Bales et al. |
| 6,590,825 B2 | 7/2003 | Tran et al. |
| 6,594,196 B2 | 7/2003 | Hsu et al. |
| 6,611,463 B1 | 8/2003 | Mehta et al. |
| 6,633,188 B1 | 10/2003 | Jia et al. |
| 6,646,919 B1 | 11/2003 | Madurawe et al. |
| 6,654,272 B2 | 11/2003 | Santin et al. |
| 6,654,286 B2 | 11/2003 | Kawakami |
| 6,661,278 B1 | 12/2003 | Gilliland |
| 6,664,909 B1 | 12/2003 | Hyde et al. |
| 6,678,190 B2 | 1/2004 | Yang et al. |
| 6,693,819 B2 | 2/2004 | Smith et al. |
| 6,693,829 B2 | 2/2004 | Babudri et al. |
| 6,714,451 B2 | 3/2004 | Ooishi et al. |
| 6,724,657 B2 | 4/2004 | Shukuri |
| 6,741,500 B2 | 5/2004 | DeShazo et al. |
| 6,791,881 B2 | 9/2004 | Shukuri et al. |
| 6,822,894 B1 | 11/2004 | Costello et al. |
| 6,845,029 B2 | 1/2005 | Santin et al. |
| 6,845,039 B2 | 1/2005 | Chen et al. |
| 6,845,044 B2 | 1/2005 | Horch et al. |
| 6,853,583 B2 | 2/2005 | Diorio et al. |
| 6,865,128 B2 | 3/2005 | Kanai |
| 6,870,767 B2 | 3/2005 | Rudelic et al. |
| 6,898,105 B2 | 5/2005 | Sakai et al. |
| 6,946,892 B2 | 9/2005 | Mitarashi |
| 6,950,342 B2 | 9/2005 | Lindhorst et al. |
| 6,995,436 B2 | 2/2006 | Kawasaki |
| 6,999,887 B2 | 2/2006 | Rehm et al. |
| 7,032,064 B2 | 4/2006 | Barnett et al. |
| 7,057,935 B2 | 6/2006 | Chevallier |
| 7,272,041 B2 | 9/2007 | Rahman et al. |
| 7,283,390 B2 | 10/2007 | Pesavento |
| 7,403,122 B1 | 7/2008 | Koepp et al. |
| 7,463,155 B2 | 12/2008 | Narlow et al. |
| 2002/0008271 A1 | 1/2002 | Hsu et al. |
| 2002/0122331 A1 | 9/2002 | Santin et al. |
| 2003/0123276 A1 | 7/2003 | Yokozeki |
| 2003/0183871 A1 | 10/2003 | Dugger et al. |
| 2003/0206437 A1 | 11/2003 | Diorio et al. |
| 2004/0004861 A1 | 1/2004 | Srinivas et al. |
| 2004/0021166 A1 | 2/2004 | Hyde et al. |
| 2004/0037127 A1 | 2/2004 | Lindhorst et al. |
| 2004/0052113 A1 | 3/2004 | Diorio et al. |

| | | |
|---|---|---|
| 2004/0195593 A1 | 10/2004 | Diorio et al. |
| 2005/0063235 A1 | 3/2005 | Pesavento et al. |
| 2005/0149896 A1 | 7/2005 | Madurawe |
| 2006/0077737 A1 | 4/2006 | Ooishi |
| 2006/0209598 A1 | 9/2006 | Wang et al. |
| 2006/0221715 A1 | 10/2006 | Ma et al. |
| 2007/0229230 A1* | 10/2007 | Drago et al. ............ 340/10.52 |

FOREIGN PATENT DOCUMENTS

| | | |
|---|---|---|
| EP | 0 326 883 | 8/1989 |
| EP | 0 336 500 | 10/1989 |
| EP | 0 756 379 | 1/1997 |
| EP | 0 776 049 | 5/1997 |
| EP | 0 778 623 | 6/1997 |

OTHER PUBLICATIONS

Chang, Leland et al., "A CMOS-Compatible Single-Poly Cell For Use As Non-Volatile Memory", International Semiconductor Device Research Symposium, Dec. 1-3, 1999, pp. 57-60.

Chung, S.S. et al., "N-Channel Versus P-Channel Flash EEPROM-Which One Has Better Reliabilities", 39th Annual IEEE International Reliability Physics Symposium, 2001, pp. 67-72.

Diorio, C. et al., "A High-Resolution Non-Volatile Analog Memory Cell", IEEE International Symposium on Circuits and Systems, vol. 3, 1995, pp. 2233-2236.

Diorio, C. et al., "A Floating-Gate MOS Learning Array with Locally Computed Weight Updates" IEEE Transactions on Electron Devices, vol. 44, No. 12, Dec. 1997, pp. 1-10.

Diorio, C., "A p-Channel MOS Synapse Transistor with Self-Convergent Memory Writes", IEEE Transaction On Electron Devices, vol. 47, No. 2, Feb. 2000, pp. 464-472.

Herdt, C. et al., "Analysis, Measurement, and Simulation of Dynamic Write Inhibit in an nvSRAM Cell", IEEE Transactions on Electron Devices, vol. 39, No. 5, May 1992, pp. 1191-1196.

Ma, Yanjun et al., "Reliability Of pFET EEPROM With 70-Å Tunnel Oxide Manufactured in Generic Logic CMOS Processes", IEEE Transactions on Device And Materials Reliability, vol. 4, No. 3, pp. 353-358, Sep. 2004.

Shi, Y. et al., "Polarity Dependent Gate Tunneling Currents in Dual-Gate CMOSFET's", IEEE Transactions on Electron Devices, vol. 45, No. 11, Nov. 1998, pp. 2355-2360.

Usuki, T. et al., "Direct Tunneling Memory: Trade-off Between Nonvolatility and High-Endurance with Low Voltage Operations", Nonvolatile Semiconductor Workshop Symposium, Aug. 12, 2001, pp. 80-81.

Vittoz, E., "Dynamic Analog Techniques", Design of Analog-Digital VLSI Circuits for Telecommunications and Signal Processing, Second Edition, Chapter 4, 1994, pp. 97-124.

Invitation to Pay Additional Fees for Application No. PCT/US2005/015606, date of mailing Nov. 18, 2005.

International Search Report and Written Opinion for International Application No. PCT/US2005/015606, date of mailing Feb. 24, 2006.

Carley, L. Richard, "Trimming Analog Circuits Using Floating-Gate Analog MOS Memory", IEEE Journal of Solid-State Circuits, vol. 24, No. 6, Dec. 1989, pp. 1569-1575.

Declercq et al., "Design and Optimization of High-Voltage CMOS Devices Compatible with a Standard 5 V CMOS Technology", IEEE Custom Integrated Circuits Conference, 1993, pp. 24.6.1-24.6.4.

Dickson, "On-Chip High-Voltage Generation in MNOS Integrated Circuits Using an Improved Voltage Multiplier Technique", IEEE Journal of Solid-State Circuits, vol. SC-11, No. 3, Jun. 1976, pp. 374-378.

IBM Technical Disclosure Bulletin, "Fuse Circuit With Zero DC Current", IBM Corporation, Jul. 1987, vol. 30, No. 2.

Raszka, J. et al., "Embedded Flash Memory for Security Applications in a 0.13 µm CMOS Logic Process", 2004 IEEE International Solid-State Circuits Conference, ISSCC, Session 2, Non-Volatile Memory, 2.4, pp. 46-47, Feb. 2004.

Witters, et al., "Analysis and Modeling of On-Chip High-Voltage Generator Circuits for Use in EEPROM Circuits", IEEE Journal of Solid-State Circuits, vol. 24, No. 5, Oct. 1989, pp. 1372-1380.

Invitation to Pay Additional Fees, Application No. PCT/US03/31792, date of mailing Apr. 2, 2004.

International Search Report, Application No. PCT/US03/31792, date of mailing Aug. 12, 2004.

International Search Report, Application No. PCT/US05/10434, date of mailing Sep. 13, 2005.

International Search Report, Application No. PCT/US05/010432, date of mailing Sep. 27, 2005.

International Search Report, Application No. PCT/US05/010431, date of mailing Sep. 27, 2005.

International Preliminary Report on Patentability, Application No. PCT/US05/10432, date of mailing Jun. 19, 2006.

* cited by examiner

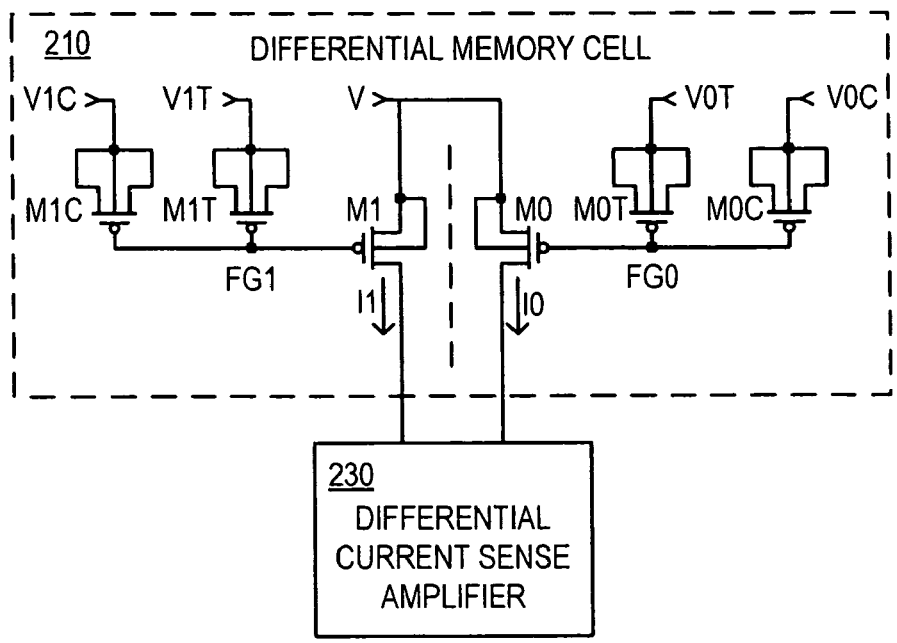
FIG. 2  *SAMPLE STORAGE ELEMENT FOR A SINGLE BIT CONFIGURATION*
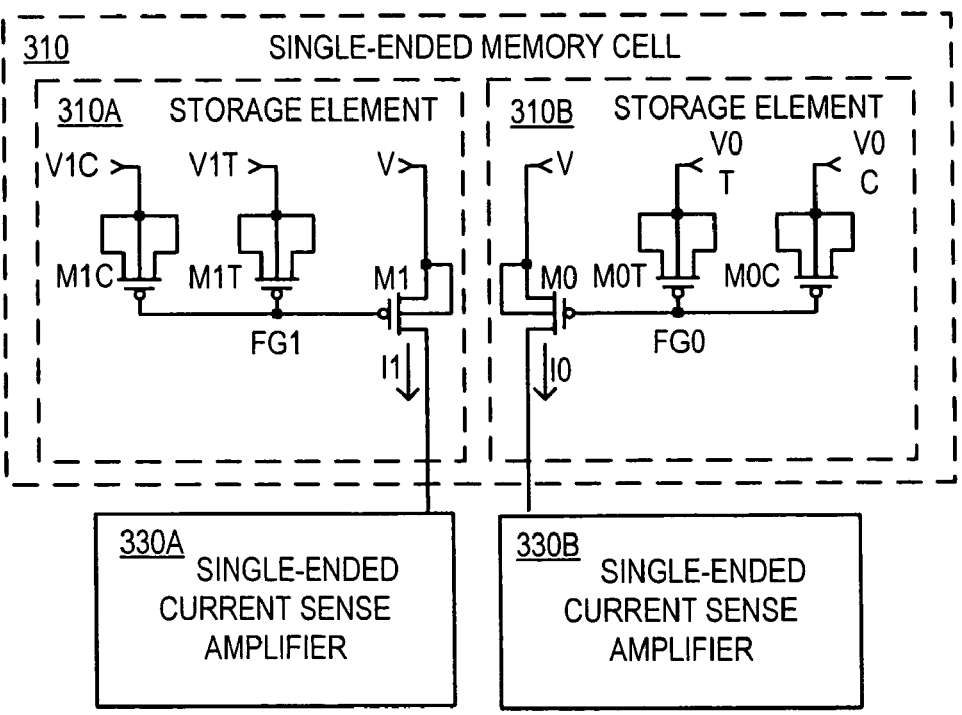
FIG. 3  *SAMPLE STORAGE ELEMENTS FOR A DUAL BITS CONFIGURATION*

*UNCOMMITTED NON VOLATILE MEMORY CELL*

*SAMPLE LAYOUT OF A NON VOLATILE MEMORY CELL*

| OPERATION | TUN | REN | RSB | D1 | D0 | FG1 | FG0 |
|---|---|---|---|---|---|---|---|
| READ 00 | 0 | VDD | 0 | 0 | 0 | 1 | 1 |
| READ 01 | 0 | VDD | 0 | 0 | 0 | 1 | -1 |
| READ 10 | 0 | VDD | 0 | 0 | 0 | -1 | 1 |
| READ 11 | 0 | VDD | 0 | 0 | 0 | -1 | -1 |
| READ IGNORE | 0 | VDD | VDD | 0 | 0 | X | X |
| IDLE | 0 | VDD | VDD | 0 | 0 | X | X |
| WRITE 00 | VTUN | 0 | VTUN/2 | 0 | 0 | 1 | 1 |
| WRITE 01 | VTUN | 0 | VTUN/2 | VTUN | 0 | 1 | -1 |
| WRITE 10 | VTUN | 0 | VTUN/2 | 0 | VTUN | -1 | 1 |
| WRITE 11 | VTUN | 0 | VTUN/2 | VTUN | VTUN | -1 | -1 |
| READ IGNORE | VTUN/2 | VTUN/2 | VTUN/2 | X | X | NC | NC |

*STATES FOR DUAL BITS OPERATIONS*

FIG. 7

| OPERATION | TUN | REN | RSB | D1 | D0 | FG1 | FG0 |
|---|---|---|---|---|---|---|---|
| READ 0 | 0 | VDD | 0 | 0 | 0 | 1 | -1 |
| READ 1 | 0 | VDD | 0 | 0 | 0 | -1 | 1 |
| READ IGNORE | 0 | VDD | VDD | 0 | 0 | X | X |
| IDLE | 0 | VDD | VDD | 0 | 0 | X | X |
| WRITE 0 | VTUN | 0 | VTUN/2 | 0 | VTUN | 1 | -1 |
| WRITE 1 | VTUN | 0 | VTUN/2 | VTUN | 0 | -1 | 1 |
| WRITE IGNORE | VTUN/2 | VTUN/2 | VTUN/2 | X | X | NC | NC |

*STATES FOR SINGLE BIT OPERATIONS*

FIG. 8

SAMPLE IMPLEMENTATION OF
CURRENT SENSE AMPLIFIERS

*SAMPLE FLOOR-PLAN OF A CONFIGURABLE MEMORY DEVICE*

MAJOR COMPONENTS OF A
CONFIGURABLE MEMORY DEVICE

SAMPLE IMPLEMENTATION
OF A COLUMN LOGIC

SAMPLE IMPLEMENTATION
OF A HIGH VOLTAGE SWITCH

SAMPLE CONNECTIVITY OF A MEMORY DEVICE

SAMPLE LAYOUT OF MEMORY CELL ARRAY
DURING DUAL BITS OPERATION

US 7,796,450 B1

RADIO FREQUENCY (RFID) TAG INCLUDING CONFIGURABLE SINGLE BIT/DUAL BITS MEMORY

CROSS REFERENCE TO RELATED APPLICATIONS

This application is a divisional of co-pending and commonly assigned U.S. patent application Ser. No. 11/981,056 filed on Oct. 30, 2007, in the name of inventors Alberto Pesavento and Jamie L. Langlinais, and entitled "Configurable Single Bit/Dual Bits Memory" which claims the benefit of U.S. Provisional Patent Application No. 60/925,939, filed on Apr. 24, 2007, entitled "Reconfigurable Single-Ended/Differential MTP Memory", the disclosure of which is hereby incorporated by reference for all purposes.

FIELD OF THE INVENTION

The present invention relates generally to nonvolatile memory. More particularly, the present invention relates to single-ended and differential-type nonvolatile memory using floating-gate p-channel field effect transistors (pFETs) to store information as electric charge.

BACKGROUND

Nonvolatile memory (NVM) is an important form of memory in today's electronic circuits. NVM is used to store serial number information, security information, settings, parameters, computer instructions (firmware), and the like. Reprogrammable NVM is particularly important in the field of tags, such as RFID (radio frequency identification) tags, which store information inexpensively and can be remotely sensed without the need to complete an actual circuit with the RFID tag itself. Such tags lack their own power supply and are powered instead by current rectified from a scanner's read-carrier RF signal received from an RFID reader/scanner.

BRIEF SUMMARY

A configurable memory device includes an array of configurable memory units arranged into rows and columns. The configurable memory unit includes a memory cell comprising a first storage element configured to store a first value and a second storage element configured to store a second value. The memory unit can be either a single-ended or a differential configuration. In the single-ended configuration, the stored value of each storage element is interpreted as one bit. In the differential configuration, the stored first and second values of the storage elements are interpreted as a single differential bit. An external control signal determines in which configuration the unit is in.

An advantage of this approach is that memory cells in the memory device can function either as a single-ended dual bits memory offering high densities or as a single bit differential memory that offers better data retention and better reliability. Conventional structures offer one or the other, but not both, so the use of the device is constrained.

These and other features and advantages of the invention will be better understood from the specification of the invention, which includes the following Detailed Description and accompanying Drawings.

BRIEF DESCRIPTION OF THE DRAWINGS

The following Detailed Description proceeds with reference to the accompanying Drawings, in which:

FIG. 2 is an electrical schematic diagram illustrating a sample storage cell for a single bit configuration according to an embodiment of the disclosure.

FIG. 3 is an electrical schematic diagram illustrating a sample storage cell for a dual bits configuration according to an embodiment of the disclosure.

FIG. 7 is a table illustrating a set of applied voltages and operating states for the memory cell of FIG. 5 operating in a dual bits configuration.

FIG. 8 is a table illustrating a set of applied voltages and operating states for the memory cell of FIG. 5 operating in a single bit configuration.

DETAILED DESCRIPTION

Figure 1:
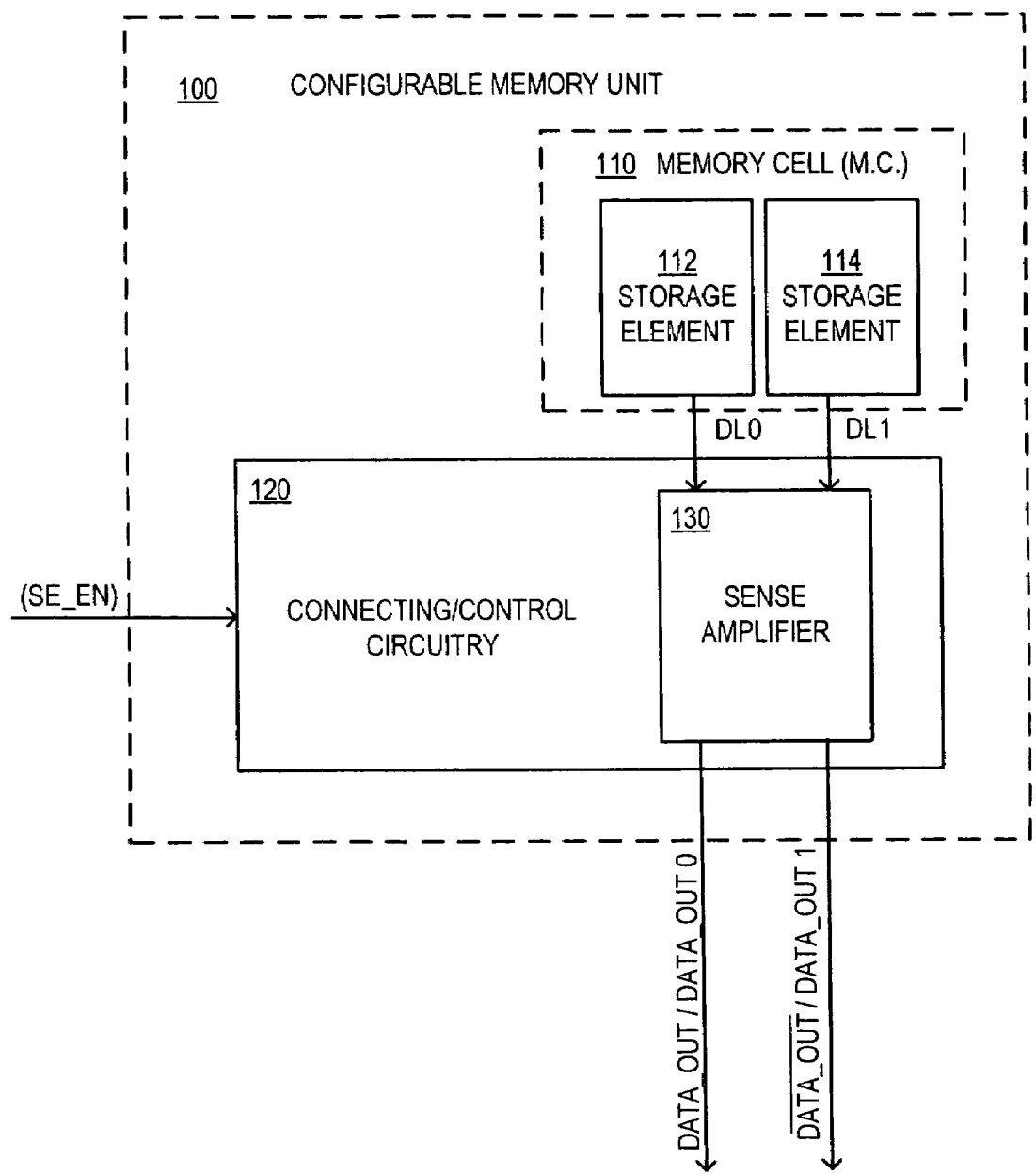
FIG. 1 is a conceptual block diagram of a configurable memory unit according to embodiments of the disclosure.

The present invention is now described. While it is disclosed in a presently preferred form, the specific embodiments of the invention as disclosed herein and illustrated in the drawings are not to be considered in a limiting sense. Rather, these embodiments are provided so that this disclosure will be thorough and complete, and will fully convey the scope of the invention to those skilled in the art. Indeed, it should be readily apparent in view of the present description that the invention might be modified in numerous ways. Among other things, the present invention may be embodied as devices, methods, software, and so on. Accordingly, the present invention may take the form of an entirely hardware embodiment, an entirely software embodiment or an embodiment combining software and hardware aspects. This description is, therefore, not to be taken in a limiting sense.

FIG. 1 is a conceptual block diagram of a configurable non-volatile memory unit 100. Memory unit 100 includes, memory cell 110, which is coupled to connecting and control circuitry (CCC) 120. Memory cell 110 is formed by two non-volatile storage elements 112 and 114, each of these elements 112 and 114 are able to store different amounts of electrons respectively. CCC 120 includes control logic and sense amplifier module 130.

Based on the configuration of CCC 120 and sense amplifier 130, memory unit 100 can be in two different configurations. In configuration one, a dual bits configuration, digital data is stored as two single bits. In configuration two, a differential configuration, digital data is stored as a differential single bit. External control signal "SE_EN", which is received by the CCC 120 determines in which of the first and second configurations the unit is in. In the first configuration, sense amplifier module 130 is arranged as to provide two independent single-ended sense amplifiers, while in the second configuration, the sense amplifier module 130 is arranged as to provide one differential sense amplifier.

FIG. 2 is an electrical schematic diagram illustrating sample storage cell 210 for a single bit configuration. The basic differential pFET NVM memory cell 210 has two floating gates denoted Fg0 and Fg1. By storing a different amount of electrons on the two floating gates, it is possible to establish a voltage differential between the two floating gates. When the memory cell is powered, through the terminal denoted "V", a difference in the readout currents I0 and I1 is present and a sense amplifier, such as a conventional current sense amplifier 230, can consequently be used to discern the logic value stored in the cell. For example, the condition I0>I1 may be used to signify the logic value "0" and the condition I0<I1 may be used to signify the logic value "1".

As shown in FIG. 2, transistors M1, M1*t* and M1*c* have floating gate Fg1 in common. Transistors M0, M0*t* and M0*c* have floating gate Fg0 in common. V1*c* is the voltage terminal for transistor M1*c*; V1*t* is the voltage terminal for transistor M1*t*; V is the voltage terminal for transistors M1 and M0; V0*t* is the voltage terminal for transistor M0*t*; and V0*c* is the voltage terminal for transistor M0*c*. As can be seen M1*c*, M1*t*, M0*t*, and M0*c*, in accordance with this illustrated embodiment, may all be shorted pFETs in that their source, drain, and well connections are all tied together as shown. The voltage terminals, referred to above, are therefore connected to the respective source, drain, and well of the shorted pFETs. M1*c*, M1*t*, M0*t*, and M0*c* may also be constructed as other types of transistors, such as nFETs. M1*c* and M0*c*, which are used as control capacitors, may also be constructed as poly-poly, or poly metal capacitors. Metal-metal capacitors can also be used for the control capacitor structures, although with existing fabrication processes this would reduce the memory retention time due to leakage from the poly contact and the metal inter-layer dielectric. By applying the appropriate voltages to terminals V01, V0*t*, V1*c*, V1*t* and V, a sufficiently large electric field can be established across the oxide dielectric of any of the three pFETs connected to each of the floating gates Fg0, Fg1, so that the well-known mechanism of Fowler-Nordheim (FN) tunneling may be used to pass electrons through the oxide dielectric of the selected transistor.

In order to establish a large electric field across one of the pFETs' oxides, the gate area of one of the two corresponding shorted pFETs (e.g., M1*c* and M1*t* shown on the left side in FIG. 2) should be made sufficiently large so that it acts as a control capacitor for the floating gate itself. Those of ordinary skill in the art will now realize that various other structures may be used to achieve the same purposes.

FIG. 3 is an electrical schematic diagram illustrating sample storage elements for a dual bits configuration. It should be noted there is no difference between the basic memory cells 210 of FIG. 2 and 310A of FIG. 3. The difference in their behavior and use are due to the differences between sense amplifiers 230 and 330A-B. Sense amplifier 230 is a differential current sense amplifier, which compares currents I0 and I1. Sense amplifiers 330A and 300B are single ended amplifiers; comparing currents I1 and I0 with an internally generated reference (not shown).

Figure 4:
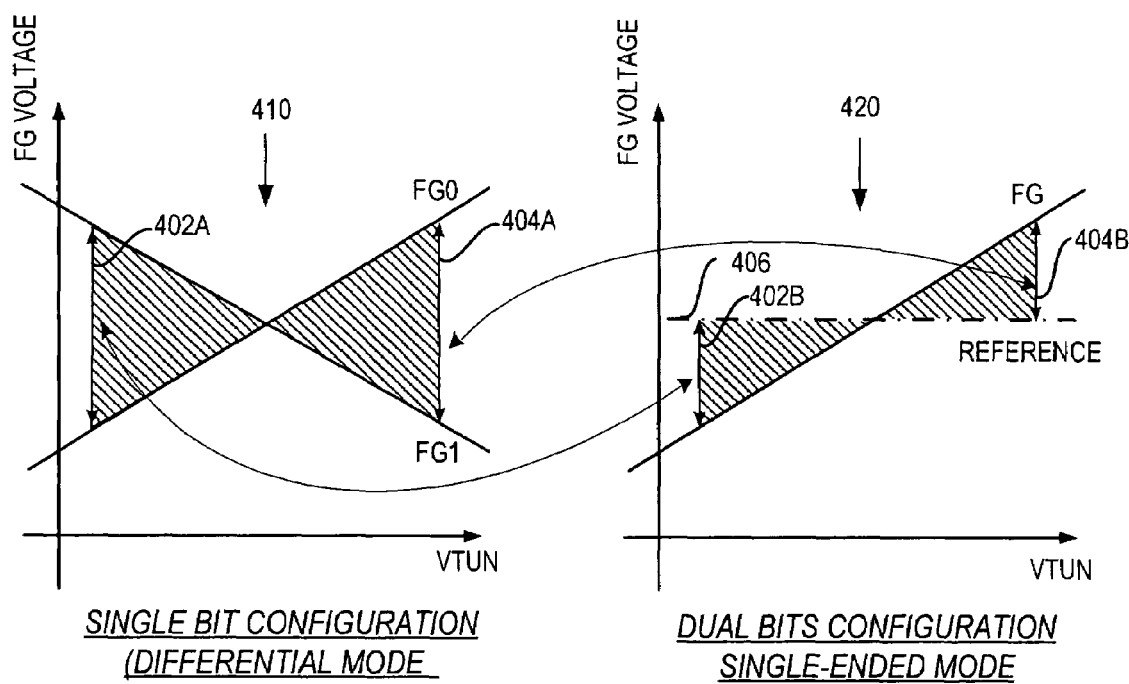
FIG. 4 is a set of diagrams showing the relationship of VTUN (tunneling voltage) vs. floating gate voltage (FG) for memory cells operating in single bit and dual bits configuration respectively, of the memory cell of FIG. 5.
Figure 5:
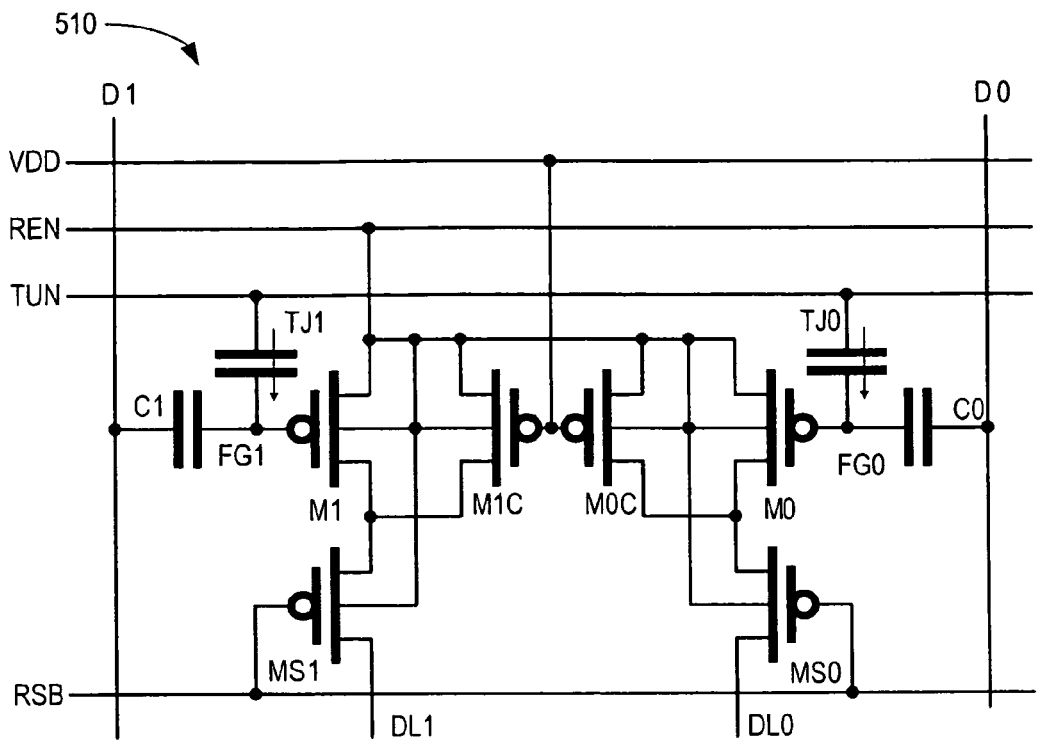
FIG. 5 is an electrical schematic diagram of a sample uncommitted memory cell according to an embodiment of the disclosure.

FIG. 4 is a pair of diagrams showing the relationship of VTUN (tunneling voltage) vs. floating gate voltage (FG) for memory cells, operating in single bit and dual bits configuration respectively, of the memory cell of FIG. 5. Diagram 410 shows a plot of Vtun (tunneling voltage) vs. floating gate voltage for the single bit differential configuration, while diagram 420 shows the same relationship for the single-ended dual bits configuration.

Single bit differential memory configuration is particularly advantageous in situations where reliable reference voltage sources are not readily available, such as, in portable devices, remotely powered devices such as RFID tags and security cards. Reading of these cells are reliable and robust due to sizes of sectors 402A and 404A, furthermore there is no reference voltage required to read the stored data. These cells provide better retention, improved defect resistance and faster READ times at the cost of increased area.

In a single-ended configuration, reference voltage 406 is generally required and a viable result may be obtained in the sectors shown as shaded and denoted 402B and 404B. The narrowness of this sector indicates that reading these cells cannot be as robust as reading a cell in the single bit differential configuration. This dual bit configuration approach, on the other hand, has the benefit of significantly reducing the area and cost. The memory cell 510, as well other versions can be easily implemented as single-ended configuration, in accordance with the teachings.

FIG. 5 is an electrical schematic diagram of a sample uncommitted memory cell 510. Drawing of memory cell 510 shows row control signal REN (row enable), TUN, RSB (row select bar) and column control signals, including the data signals D1 and D0. These signals are used to control memory cell 510 and facilitate the formation of a logic array using a plurality of memory cells, like memory cell 510.

Drawing of memory cell 510 shows the tunneling transistors as capacitors, denoted TJ1 and TJ0 and the control transistors as capacitors, denoted C1 and C0 for clarity, but they may be implemented with pFETs, as illustrated for example, in FIG. 2 and discussed above. In this embodiment, VDD is provided at all times to bias the gates of transistors M1*d* and M0*d*. Memory cell 510 also shows two additional pFETs M1*d* and M0*d*, in comparison to FIG. 2. As can be seen from the table in FIG. 8, shown below, during read operations, the REN (row enable) line is set to VDD and with the gates of M1*d* and M0*d* at VDD. M1*d* and M0*d* are not conducting and readout transistors M1 and M0 operate normally to provide an output current as the function of charges stored on corresponding floating gates Fg1 and Fg0. During a write operation for a different cell in the same column, REN is set to approximately half the tunneling voltage. With VDD on the gates of M1*d* and M0*d*, M1*d* and M0*d* conduct effectively connecting the drain nodes of M1 and M0 to REN. Since the drain, source, and bulk nodes of both M1 and M0 are set to half the tunneling voltage, there can be no tunneling across M1 or M0. Moreover, since TUN is also set to half the tunneling voltage during this write protect mode, there can be no tunneling across TJ1 or TJ0. Memory cell 510 further includes a pair of nFET readout transistors Ms1 and Ms0, configured as row-select transistors, which control current flow in the drain legs of readout transistors M1 and M0, respectively.

Figure 6:
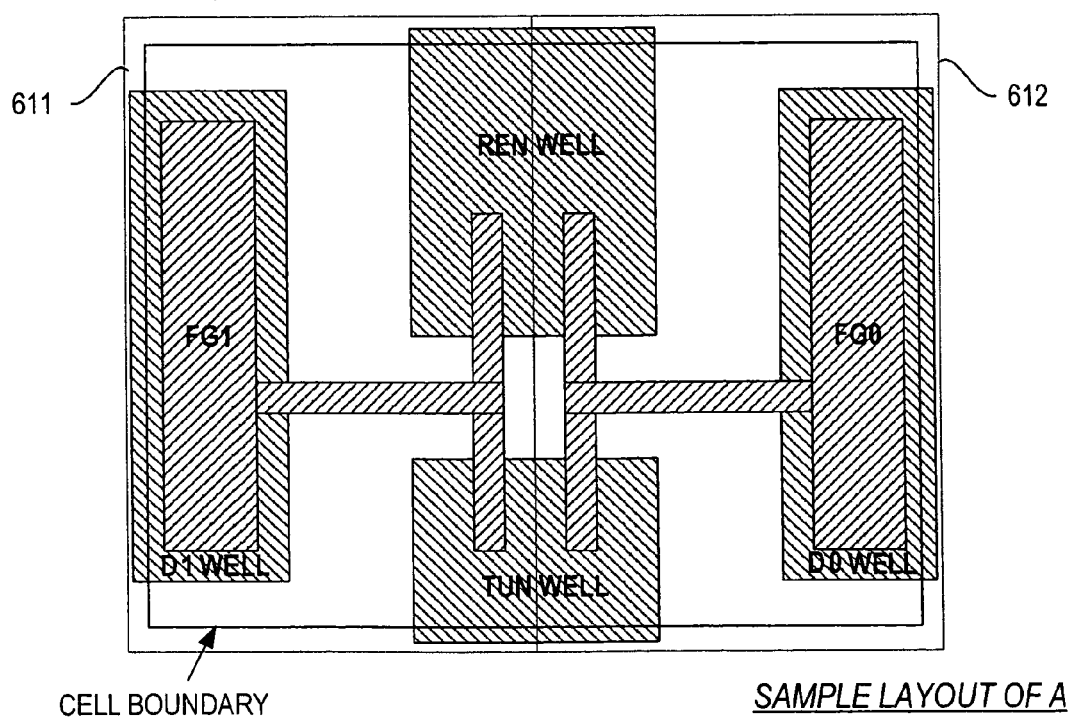
FIG. 6 is a sample layout of the memory cell of FIG. 5.

FIG. 6 is a sample layout of the memory cell 610 of FIG. 5. The memory cell 610 includes two almost symmetrical memory elements 611 and 612. In each element there are three n-wells, a D well, a REN well and a TUN well. As FIG. 6 illustrates TUN wells and REN wells, for the two memory elements 611 and 612 are merged together. Circuit elements, transistors, capacitors are formed inside the wells. Capacitor C1 is formed inside the D1 well, tuning capacitor TJ1 is formed inside the TUN well, while transistors M1, M1C, and MS1 are formed inside the REN well.

FIGS. 7 and 8 illustrate how the applied control voltages determine the operating states for memory cell 510. FIG. 7 shows the control and operating state for the dual bits configuration, while FIG. 8 shows the control and operating state for the differential single bit configuration. By looking at the tables on FIGS. 7 and 8, one can observe that there is no difference in operating the memory cell in the single bit or in the dual bits configuration. What make the difference is how the sense amplifiers are configured and how the input data are handled.

Figure 9:
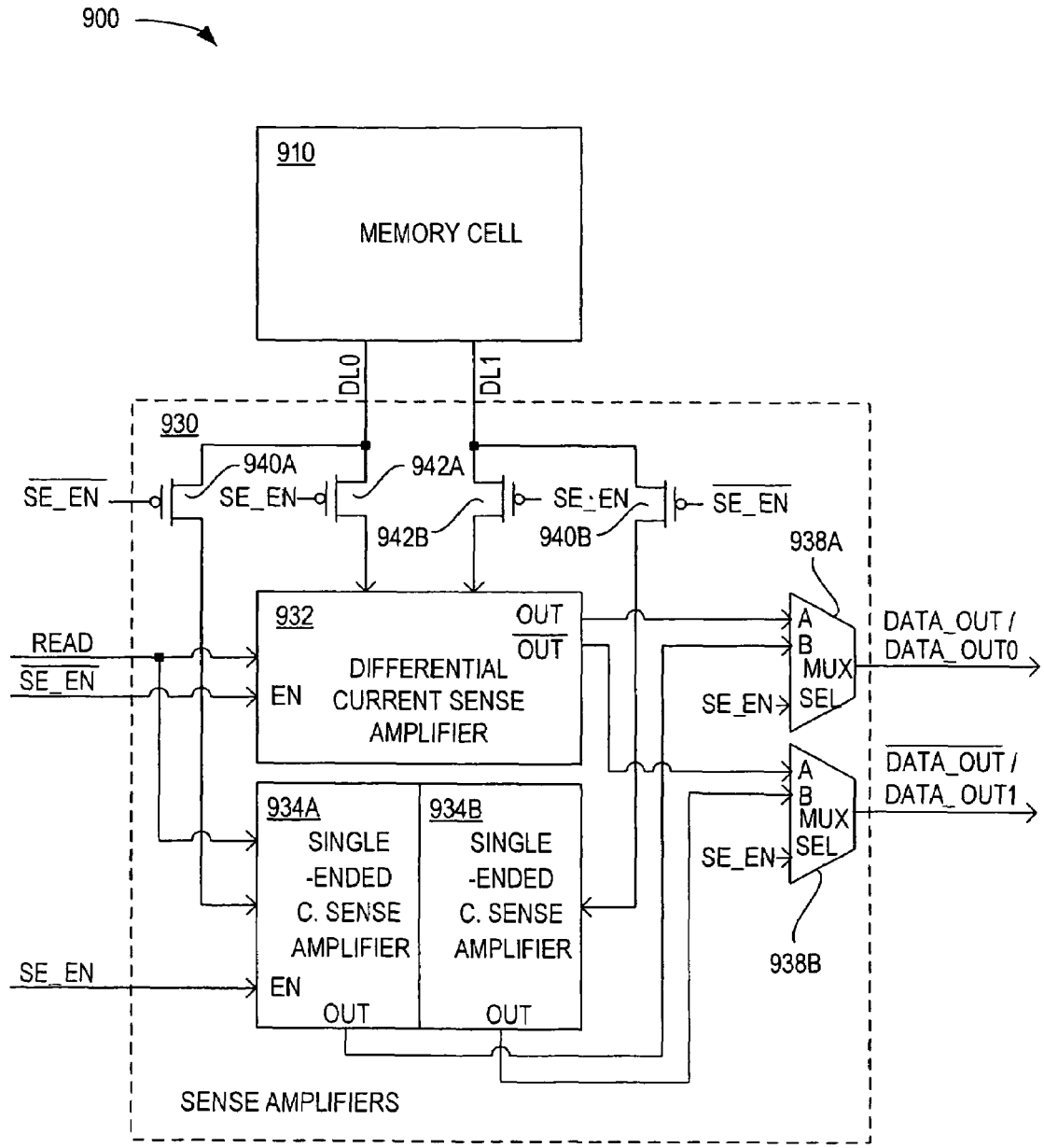
FIG. 9 is a schematic diagram illustrating a sample implementation of a current sense amplifier module for the configurable memory unit of FIG. 1 according to an embodiment of the disclosure.

FIG. 9 is a schematic diagram illustrating a sample implementation of current sense amplifier module 930 for the configurable memory unit of FIG. 1. Sense amplifier module 930 has a switchable architecture that enables the sense amplifier to sense both single ended and differential data. Module 930 includes two sets of current sense amplifiers, differential sense amplifier 932 and two independent single ended sense amplifiers 934A and 934B. Sense amplifiers 932 and 934A-B sample currents of lines DL0 and DL1 through current steering switches 940A, 942A, and 940B, 942B respectively. Module 930 also includes additional control circuitry; a pair of data-output selector multiplexers 938A and 938B. Multiplexers 938A and 938B are outputting either a single bit differential data or dual bits data. External control signals Single End Enable (SE_EN) and "SE_EN not" are received by sense amplifier module 930. SE_EN=true configures the module to work as two independent single ended sense amplifiers, while SE_EN=false configures the module to work as a differential sense amplifier. In case of sensing differential data, sense amplifier 932 compares two currents sourced by memory cell 910, while sensing single ended data sense amplifiers 934A and 934B compare currents in data lines DL0 and DL1 to a fixed reference current respectively.

Figure 10:
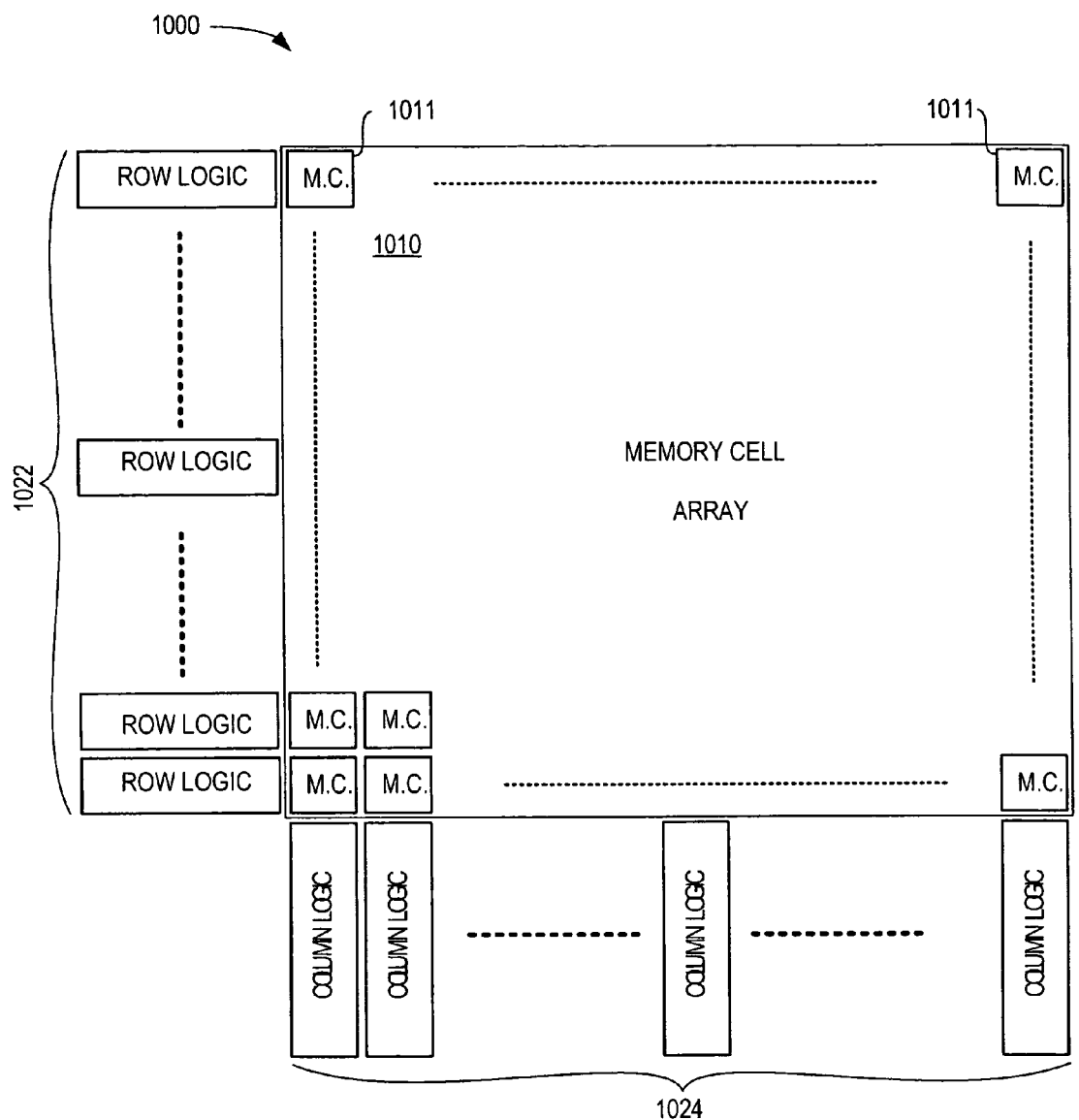
FIG. 10 is a sample floor plan of a configurable memory device according to embodiments of the disclosure.

FIG. 10 is a sample floor plan of a configurable memory 1000. Memory device 1000 includes an array of memory cells 1010, where memory cells 1011 are like memory cell 610 in FIG. 6, and they are arranged into rows and columns. Each row and column of the array 1010 have their associated row logic blocks 1022 and column logic blocks 1024. It is not necessary to form the memory array from identical memory cells. The present disclosure supports memory devices, which are populated with identical cells. It also supports hybrid devices where cells are different in their operating properties or devices. Memory array 1010 may be formed using both configurable and non-configurable memory cells.

Figure 11:
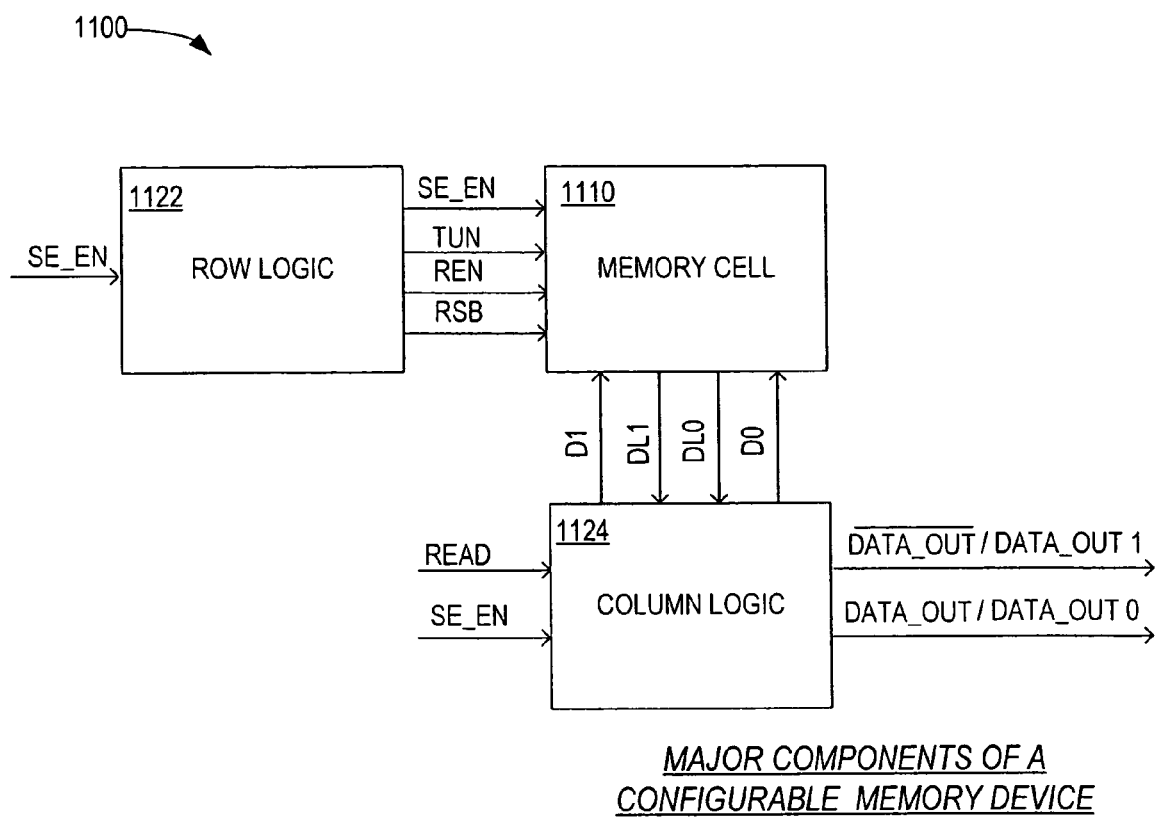
FIG. 11 is a block diagram illustrating the major components of the configurable memory device of FIG. 10 according to embodiments of the disclosure.

FIG. 11 is a block diagram. Block diagram 1100 shows three major components of the configurable memory device of FIG. 10. The components include memory cell 1110, row logic block 1122, and column logic block 1124. Row logic 1122 block and column logic blocks 1124 together constitute the CCC. It is the CCC that receives the external control signal SE_EN. Row logic block 1122 and column logic block 1124 are coupled to memory cell 1110 and they provide the necessary voltage level to perform a memory operation (e.g. read, and write).

The row-logic 1122, depicted in FIG. 11, includes three sets of cells to provide TUN, REN, and RSB voltages. These voltages facilitate the selection of a row of a memory array for a memory operation. The TUN logic (not shown) includes a high-voltage switch connecting to a medium voltage switch. The REN logic (not shown) includes a medium voltage switch connecting to another medium voltage switch. The RSB logic includes single medium voltage switch. The high voltage switch and the medium voltage switch have two possible outputs states Vtun and Gnd for the TUN logic and Vtun/2 and Gnd for the REN logic. Column logic 1124 facilitates the selection of a column of a memory array for a memory operation. Column logic 1124 includes the same high-voltage switch found in the row-logic used to control the D1 and D0 lines. It also includes sense-amplifiers to determine the logic value from the drain lines DL1, DL0 and there is additional logic to handle input/output data. Memory cell 1110 can be made in any suitable way; one such way is shown in FIG. 6.

Figure 12:
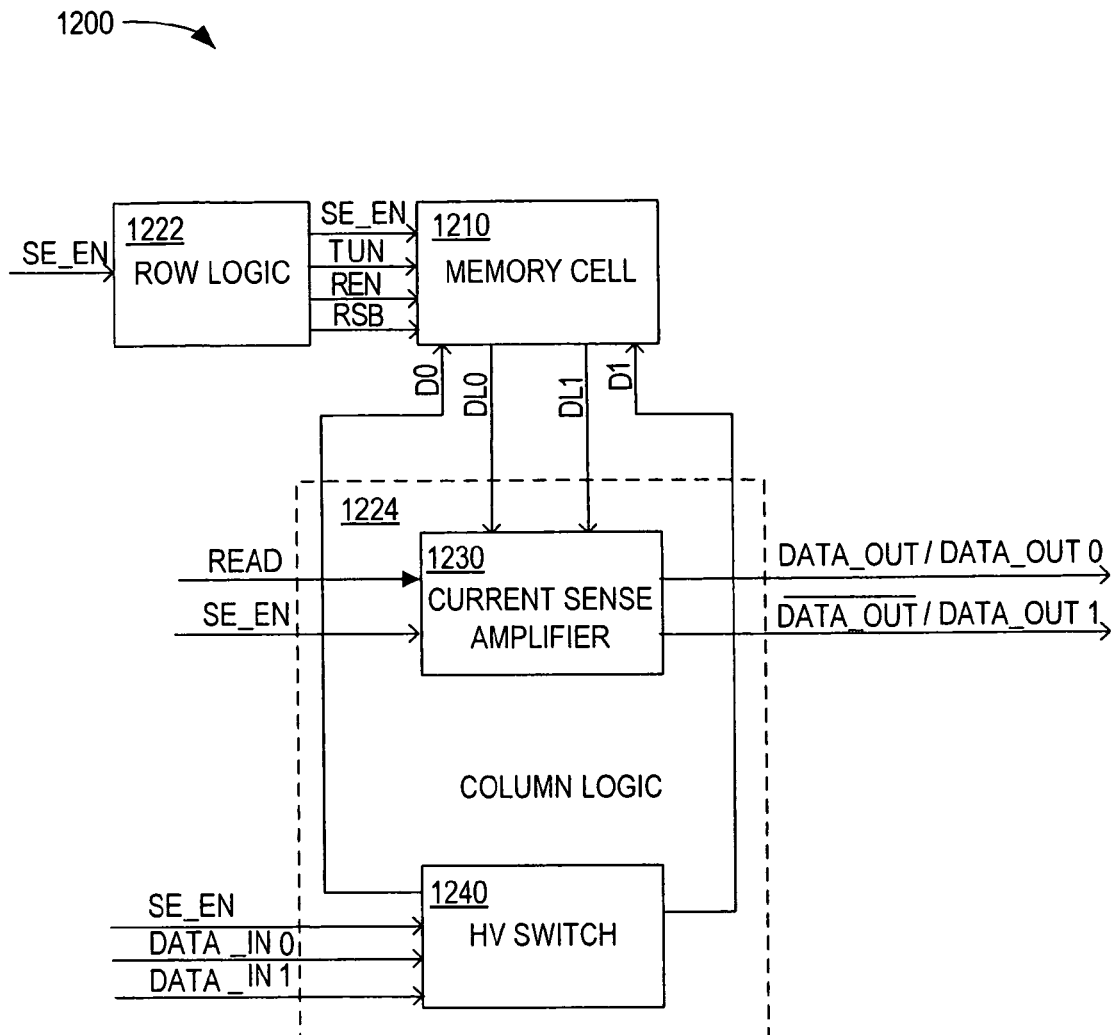
FIG. 12 is a block diagram illustrating a sample implementation of a column logic of FIG. 11 according to embodiments of the disclosure.

FIG. 12 is block diagram 1200. Block Diagram 1200 illustrates a sample implementation of column logic block 1224 of FIG. 11. Column logic block 1224 includes two key components; current sense amplifier block 1230 and HV switch module 1240, controlling column select D0, and D1 lines. Amplifier block 1230 can be made in any suitable way; one such way is shown in FIG. 9. A more detailed description of the HV module is provided below.

Figure 13:
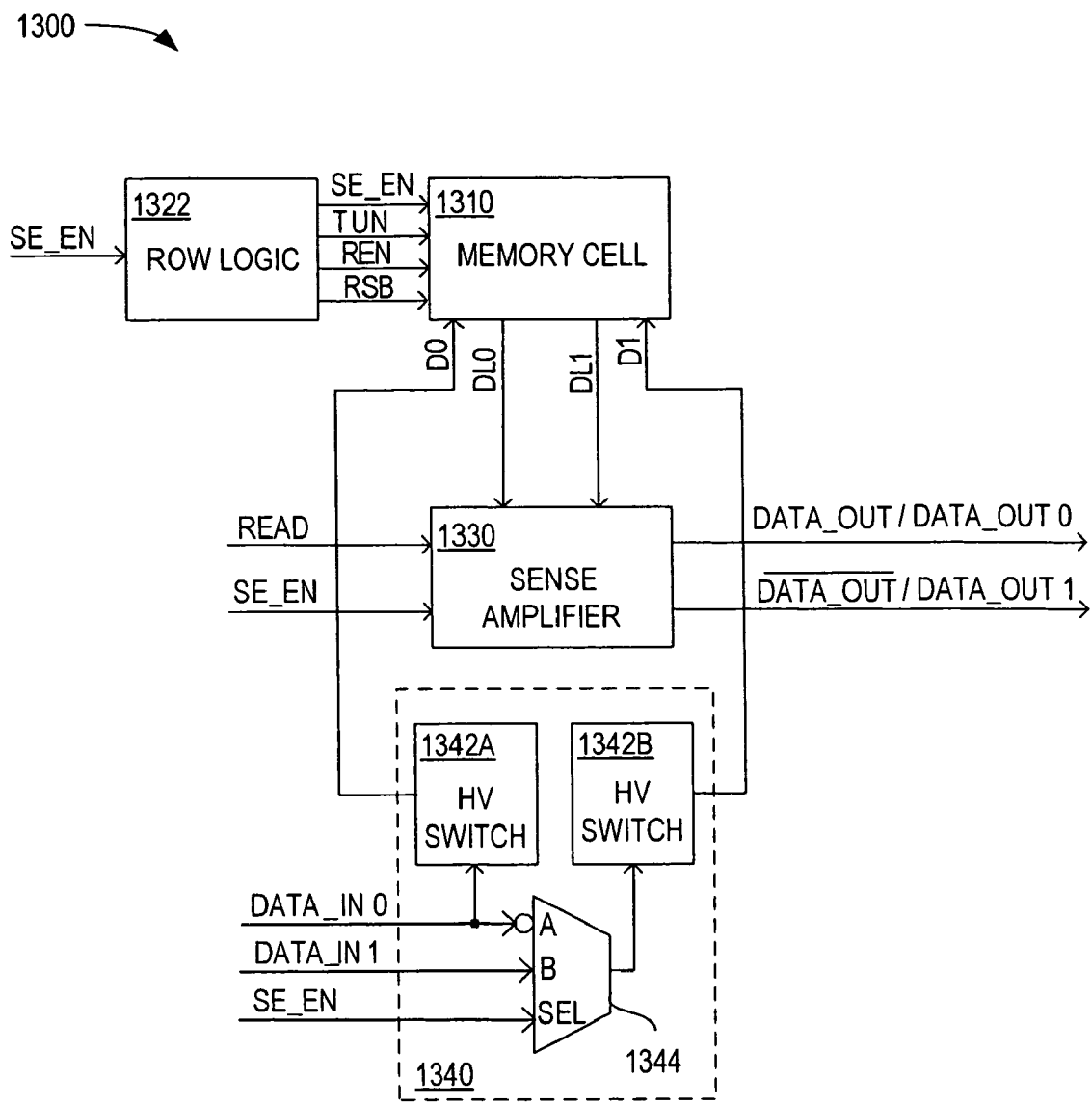
FIG. 13 is a block diagram illustrating a sample implementation of a High Voltage (HV) switch of FIG. 12 according to embodiments of the disclosure.

FIG. 13 is a block diagram illustrating a sample implementation of configurable HV switch module 1340 of FIG. 12. HV module 1340 receives input data to be stored and the control signals SE_EN to indicate how to store the received data. HV module 1340 includes a pair of HV switches, 1342A and 1342B; these switches provide the required VTUN voltage level during writing a logic value "1" into an associated memory element. HV switches 1342A and 1342B are capable to switch in voltages during programming operation. HV switch module 1340 also includes a data selection multiplexer 1344. Multiplexer 1344 is coupled to HV switches 1342A and 1342B and it determines whether two bits of data or a differential single bit of datum is stored in the memory cell.

Figure 14:
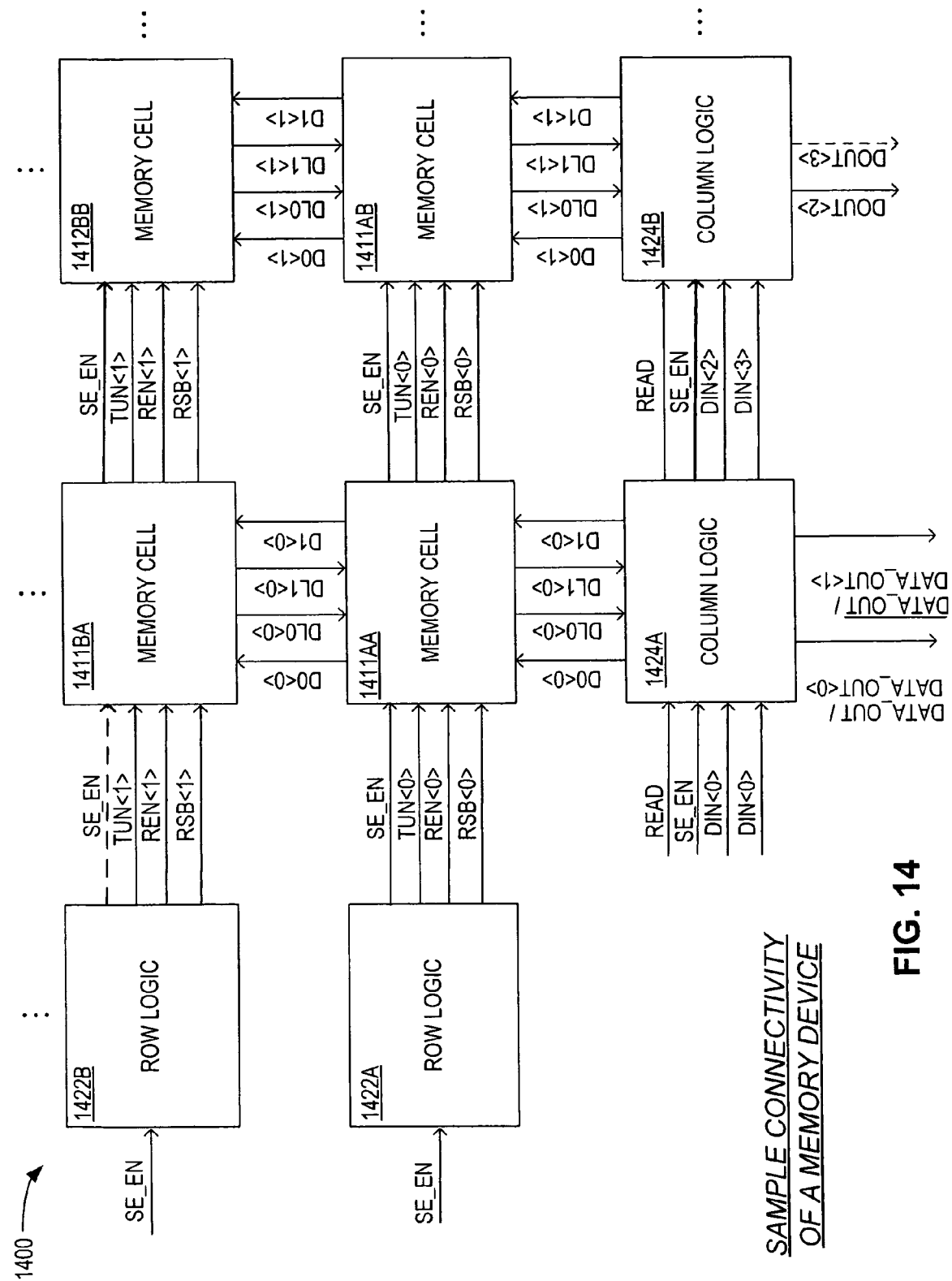
FIG. 14 is a block diagram illustrating a sample connectivity of the memory device of FIG. 10 according to embodiments of the disclosure.

FIG. 14 is a block diagram of memory 1000 illustrating a sample connectivity of memory device of FIG. 10, that includes the memory cells of FIG. 5, row logic and column logic blocks of FIG. 11 according to one embodiment. As mentioned previously, a plurality of memory cells are arranged in rows and columns. In memory device 1000, cells 1411AA through 1411AN are arranged in a row storing bits 1 through N, respectively. Similarly, cells 1411BA through 1411BN form the second row storing a second word and cells 1411NA through 1411NM form Mth row storing an Mth word. M and N are integers indicating a maximum row and column number, respectively.

Figure 15:
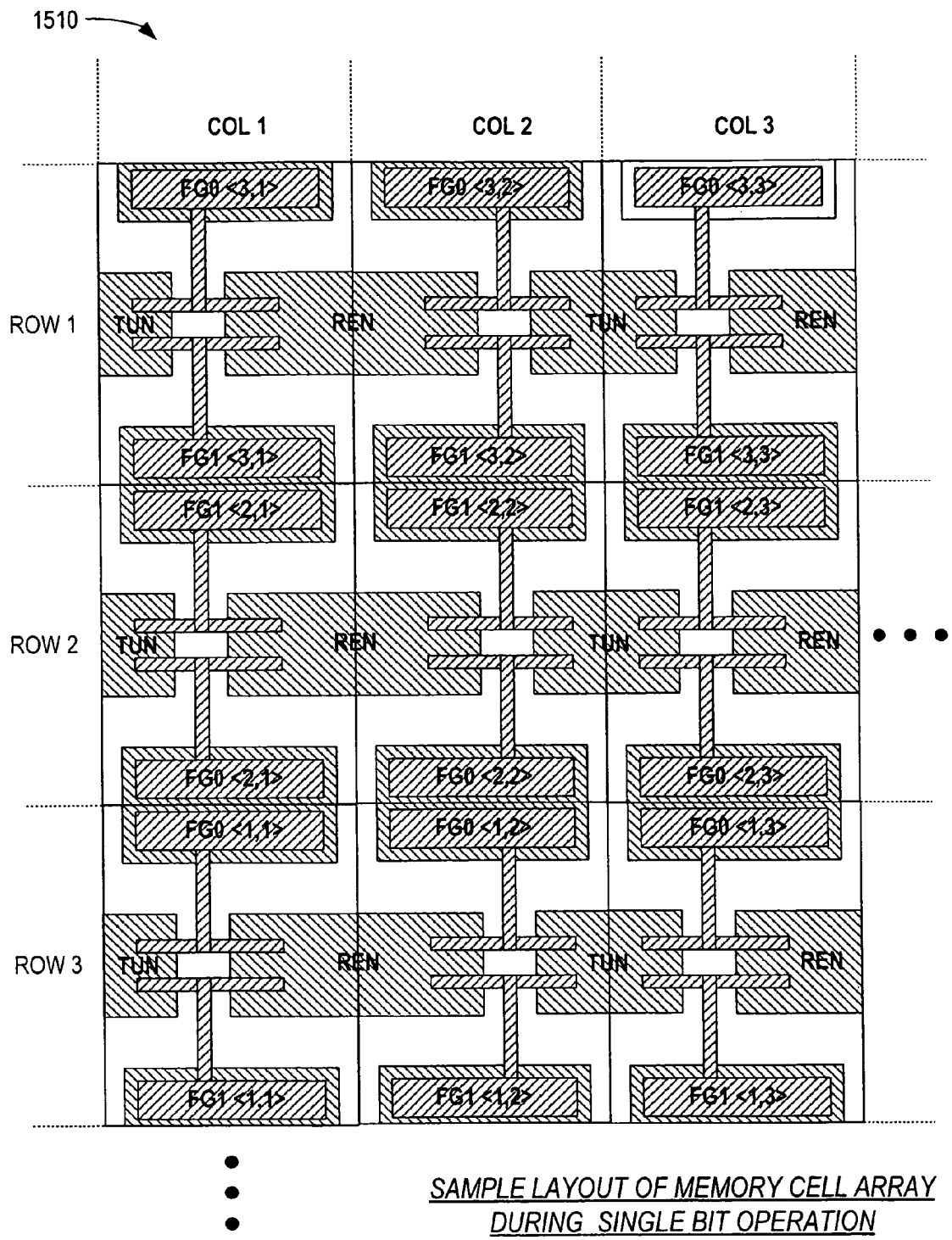
FIG. 15 is a sample layout of memory cell array 1100 of the device of FIG. 10, when the cells are configured for dual bits operation according to embodiments of the disclosure.
Figure 16:
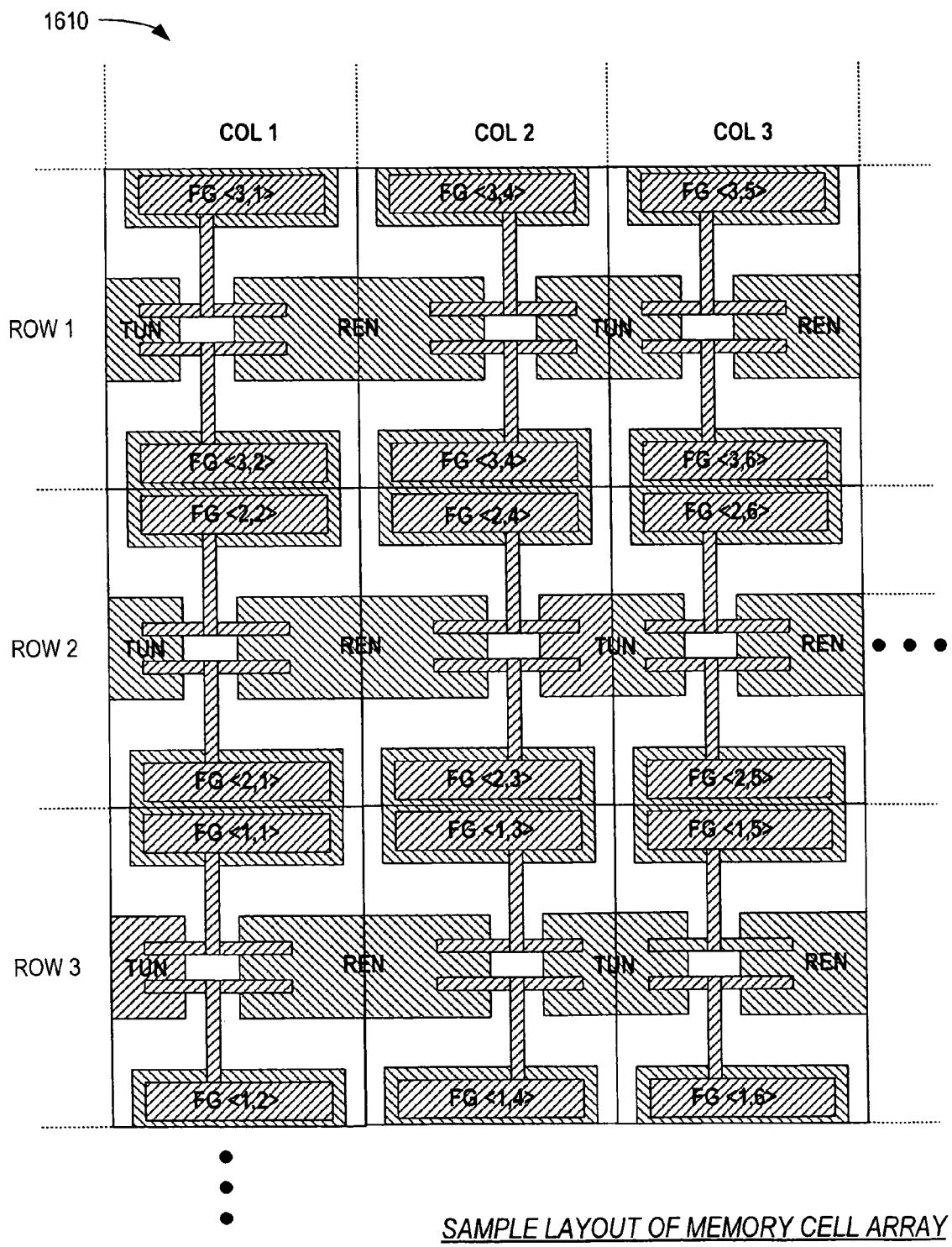
FIG. 16 is a sample layout of memory cell array 1100 of the device of FIG. 10, when the cells are configured for dual bits operation according to embodiments of the disclosure.

FIGS. 15 and 16 are sample layouts of the memory cell arrays of 1510 and of 1610 of device of FIG. 10. In array 1510, the cells are configured for differential single bit operation, while in array 1610; the cells are configured for dual bits operation according to embodiments of the disclosure. It should be noted that the two physical layouts are identical. The difference is only logical, in terms whether the stored value is interpreted by the sense amplifier as dual bits or a differential single bit.

Numerous details have been set forth in this description, which is to be taken as a whole, to provide a more thorough understanding of the invention. In other instances, well-known features have not been described in detail, so as to not obscure unnecessarily the invention.

The invention includes combinations and subcombinations of the various elements, features, functions, and/or properties disclosed herein. The following claims define certain combinations and subcombinations, which are regarded as novel and non-obvious. Additional claims for other combinations and subcombinations of features, functions, elements, and/or properties may be presented in this or in a related document.

What is claimed is:

1. A radio frequency identification (RFID) tag, comprising:
an antenna;
a connecting and control circuitry that includes sense amplifiers; and
a circuit coupled to the antenna, the circuit having a processor and a configurable non-volatile memory unit, the non-volatile memory unit including:
a memory cell, having a first storage element able to store a first value, and a second storage element able to store a second value,
wherein the unit is configured to be in one of a first configuration where a first bit is stored as the first value and a second bit is stored as the second value and in a second configuration where a single bit is stored as a difference between the first value and the second value; and
wherein the connecting and control circuitry determines whether the memory unit is in the first configuration or in the second configuration.

2. The RFID tag of claim 1, wherein an external control signal determines which of the first and second configurations the unit is in.

3. The RFID tag of claim 1, wherein the external control signal is received by the connecting and control circuitry.

4. The RFID tag of claim 1, wherein in the first configuration, the sense amplifiers are arranged as two independent single-ended sense amplifiers, and wherein in the second configuration, the sense amplifiers are arranged as one differential sense amplifier.

5. A radio frequency identification (RFID) tag, comprising:
an antenna; and
a circuit coupled to the antenna, the circuit having a processor and a configurable non-volatile memory unit, the non-volatile memory unit including:
an array of memory cells arranged into rows and columns, at least one of the memory cells including an associated first storage element able to store a first value and an associated second storage element able to store a second value;
a plurality of row logic blocks; and
a plurality of column logic blocks,
wherein the at least a certain one of the memory cells and an associated row logic block and column logic block is configured to be in one of a first configuration where a first bit is stored as the first value and a second bit is stored as the second value, and a second configuration where a single bit is stored as a difference between the first and the second values.

6. The RFID tag of claim 5, wherein all the cells are identically made.

7. The RFID tag of claim 5, wherein at least one of the cells is made differently from other ones of the cells.

8. The RFID tag of claim 5, wherein not all the memory cells are so configurable.

9. The RFID tag of claim 5, wherein all the memory cells are so configurable.

10. The RFID tag of claim 5, wherein an external control signal determines which of the first and second configurations the certain memory cell and the associated row logic block and column logic block are in.

11. The RFID tag of claim 10, wherein the external control signal is received by one of the associated row and column logic blocks.

12. The RFID tag of claim 5, wherein the associated column logic block includes a configurable sense amplifier module and a configurable high voltage (HV) switch module.

13. The RFID tag of claim 12, wherein the sense amplifier module includes a differential current sense amplifier, two single-ended amplifiers, a data selection multiplexer, and wherein current steering switches are disposed between outputs of the memory cell and inputs of the sense amplifiers.

14. The RFID tag of claim 12, wherein in the first configuration, the sense amplifier is arranged as two independent single-ended sense amplifiers, and wherein in the second configuration, the sense amplifier is arranged as a differential sense amplifier.

15. The RFID tag of claim 12, wherein the HV module includes at least one HV switch and a configuration selection multiplexer, receiving data inputs and the control signal, and wherein the control signal determines what data is stored in the memory cell.

16. The RFID tag of claim 15, wherein in the first configuration, the HV switch and the multiplexer are arranged to support a dual bits operation, and wherein in the second configuration, the HV switch and the multiplexer are arranged to support a single bit differential operation.

17. A method for utilizing a radio frequency identification (RFID) tag having an antenna and a circuit coupled to the antenna, the circuit having a processor and a configurable non-volatile memory unit having a memory cell with a first storage element and a second storage element, the method comprising:
configuring the memory unit to be in one of a first configuration and a second configuration;
storing a first value in the first storage element; and
storing a second value in the second storage element,
wherein in the first configuration a first bit is configured to be stored as the first value and a second bit is configured to be stored as the second value, and in the second configuration a single bit is configured to be stored as a difference between the first value and the second value,
wherein the memory unit includes connecting and control circuitry including a sense amplifier, and
wherein the connecting and control circuitry determines whether the memory unit is in the first configuration or in the second configuration.

18. The method of claim 17, wherein configuring is performed in response to an external control signal.

19. The method of claim 18, wherein the external control signal is received by the connecting and control circuitry.

20. The method of claim 17, wherein in the first configuration, the sense amplifier is arranged as two independent single-ended sense amplifiers, and wherein in the second configuration, the sense amplifier is arranged as a differential sense amplifier.

21. A method for forming a radio frequency identification (RFID) tag having an antenna and a circuit coupled to the antenna, the circuit having a processor and a configurable non-volatile memory unit having an array of memory cells, the method comprising:
forming the array of memory cells into rows and columns, each of at least one of the memory cells including a first storage element able to store a first value and a second storage element able to store a second value;
forming a plurality of row logic blocks; and
forming a plurality of column logic blocks,
wherein at least a certain one of the memory cells and an associated row logic block and column logic block is configured to be in one of a first configuration, wherein a first bit is stored as the first value and a second bit is stored as the second value, and a second configuration where a single bit is stored as a difference between the first and the second values.

22. The method of claim 21, wherein an external control signal determines in which of the first and second configurations the certain memory cell and the associated row logic block and column logic block are in.

23. The method of claim 22, wherein the external control signal is received by one of the associated row and column logic blocks.

* * * * *